US012701998B2

(12) United States Patent
Kim et al.

(10) Patent No.: US 12,701,998 B2
(45) Date of Patent: Aug. 4, 2026

(54) HEAT SPREADER ASSEMBLY FOR USE WITH A SEMICONDUCTOR DEVICE

(71) Applicant: STATS ChipPAC Pte. Ltd., Singapore (SG)

(72) Inventors: KyungEun Kim, Incheon (KR); YouJin Shin, Incheon (KR); InWeon Ra, Seoul (KR)

( * ) Notice: Subject to any disclaimer, the term of this patent is extended or adjusted under 35 U.S.C. 154(b) by 285 days.

(21) Appl. No.: 18/354,655

(22) Filed: Jul. 19, 2023

(65) Prior Publication Data

US 2024/0030088 A1      Jan. 25, 2024

(30) Foreign Application Priority Data

Jul. 20, 2022    (CN) .......................... 202210863356.2

(51) Int. Cl.
H01L 23/367 (2006.01)
H01L 23/00 (2006.01)

(52) U.S. Cl.
CPC .......... H01L 23/3675 (2013.01); H01L 24/32 (2013.01); H01L 2224/32245 (2013.01)

(58) Field of Classification Search
CPC ................. H01L 23/3675; H01L 24/32; H01L 2224/32245
See application file for complete search history.

(56) References Cited

U.S. PATENT DOCUMENTS

| | | | |
|---|---|---|---|
| 4,978,638 A | 12/1990 | Buller et al. | |
| 5,724,228 A | 3/1998 | Lee | |
| 5,825,622 A | 10/1998 | Rife et al. | |
| 6,021,045 A | 2/2000 | Johnson | |
| 6,191,478 B1 | 2/2001 | Chen | |
| 6,849,942 B2 | 2/2005 | Lin et al. | |
| 2011/0176279 A1* | 7/2011 | Zhao | H01L 23/552 |
| | | | 361/720 |
| 2016/0066482 A1* | 3/2016 | Chi | H05K 9/0032 |
| | | | 174/378 |

FOREIGN PATENT DOCUMENTS

| | | |
|---|---|---|
| CN | 105932003 A | 9/2016 |
| CN | 107424985 B | 9/2019 |
| TW | 200610114 A | 3/2006 |

* cited by examiner

*Primary Examiner* — Peniel M Gumedzoe
(74) *Attorney, Agent, or Firm* — .Junhe Law Office, P.C.; Yi Zhang

(57) ABSTRACT

Provided is a heat spreader assembly comprising: a pair of locking bars mounted on a substrate of a semiconductor device and at two opposite sides of at least one semiconductor die, wherein each of the pair of locking bars comprises a plurality of locking hooks disposed along the locking bar and defines a slot; and a heat spreader comprising: a heat spreader body comprising a top portion and a pair of lateral portions, the heat spreader body defining a space for receiving the at least one semiconductor die; and a pair of protrusion ribs extending in opposite directions from the pair of lateral portions, respectively, wherein the pair of protrusion ribs is configured to slide past the locking hooks of the pair of locking bars and be engaged within the slots to prevent the heat spreader from moving away from the substrate of the semiconductor device.

17 Claims, 9 Drawing Sheets

830

820

820

HEAT SPREADER ASSEMBLY FOR USE WITH A SEMICONDUCTOR DEVICE

TECHNICAL FIELD

The present application generally relates to semiconductor technologies, and more particularly, to a heat spreader assembly for use with a semiconductor device.

BACKGROUND OF THE INVENTION

Semiconductor devices are commonly found in modern electronic products, which perform a wide range of functions, such as signal processing, high-speed computing, transmitting and receiving electromagnetic signals, controlling electronic devices, and creating visual images for television displays. An integrated circuit can be fabricated within a semiconductor die. The semiconductor die can also be referred to as a chip, and the die can be a so-called "flip-chip". A flip-chip has a surface that includes conductive protrusions, which can be referred to as "bumps".

During operation, the circuits in the semiconductor die can generate heat which requires a heat spreader to transfer from the die to a surrounding environment. A conventional heat spreader includes a foot portion and a slope sidewall portion for attaching the heat spreader onto a substrate where the semiconductor die is mounted, and thus a mounting space is required on the substrate for the foot portion and slope sidewall portion.

However, it is desired to mount more and more components such as a big semiconductor die and small discrete components on the substrate. For example, FIG. 1 shows a semiconductor device 100 that includes a big semiconductor die 101 and lots of discrete components 102 mounted on a substrate 103 and surrounding the big semiconductor die 101. As can be seen from FIG. 1, some of the discrete components 102 may occupy the space for mounting the foot portion 104 and the slope sidewall portion 105 of the conventional heat spreader, therefore the space for the heat spreader is limited. In a nutshell, conventional heat spreader configuration is not suitable for a tight substrate layout.

Another aspect to be considered is the way of disposing a heat spreader on the semiconductor die. In some conventional settings, a heat spreader may be directly secured onto a semiconductor die, without any foot portion attached on the substrate for the semiconductor die. In such settings, stronger attachment may be desired between the semiconductor die and the substrate to withstand a total weight of both the semiconductor die and the heat spreader. In other conventional settings, a heat spreader may be secured at lateral surfaces of the substrate to avoid occupying the top surface of the substrate. In such settings, an extra structure may be needed for engaging the heat spreader with the lateral surfaces of the substrate.

Therefore, a need exists for an improved heat spreader for use with a semiconductor device.

SUMMARY OF THE INVENTION

An objective of the present application is to provide a heat spreader assembly for use with a semiconductor device, with an improved layout design of the semiconductor device.

According to one aspect of the present application, a heat spreader assembly for use with a semiconductor device is provided, comprising: a pair of locking bars mounted on the substrate of the semiconductor device and at two opposite sides of the at least one semiconductor die, wherein each of the pair of locking bars comprises a plurality of locking hooks disposed along the locking bar and defines a slot extending along the locking bar; and a heat spreader comprising: a heat spreader body comprising a top portion and a pair of lateral portions extending from the top portion, the heat spreader body defining a space for receiving the at least one semiconductor die; and a pair of protrusion ribs extending in opposite directions from the pair of lateral portions, respectively, wherein the pair of protrusion ribs is configured to, when the heat spreader body is pushed towards the substrate, slide past the locking hooks of the pair of locking bars and be engaged within the slots to prevent the heat spreader from moving away from the substrate of the semiconductor device.

According to another aspect of the present application, a semiconductor assembly is provided. The semiconductor assembly comprises: a semiconductor device comprising a substrate and at least one semiconductor die mounted on the substrate; and a heat spreader assembly mounted with the semiconductor device, comprising: a pair of locking bars mounted on the substrate of the semiconductor device and at two opposite sides of the at least one semiconductor die, wherein each of the pair of locking bars comprises a plurality of locking hooks disposed along the locking bar and defines a slot extending along the locking bar; and a heat spreader comprising: a heat spreader body comprising a top portion and a pair of lateral portions extending from the top portion, the heat spreader body defining a space for receiving the at least one semiconductor die; and a pair of protrusion ribs extending in opposite directions from the pair of lateral portions, respectively, wherein the pair of protrusion ribs is configured to, when the heat spreader body is pushed towards the substrate, slide past the locking hooks of the pair of locking bars and be engaged within the slots to prevent the heat spreader from moving away from the substrate of the semiconductor device.

According to another aspect of the present application, a method for making a semiconductor assembly is provided. The method comprises: providing a semiconductor device, wherein the semiconductor device comprises a substrate and at least one semiconductor die mounted on the substrate; providing a pair of locking bars, wherein each of the pair of locking bars comprises a plurality of locking hooks disposed along the locking bar and defines a slot extending along the locking bar; providing a heat spreader comprising: a heat spreader body comprising a top portion and a pair of lateral portions extending from the top portion, the heat spreader body defining a space for receiving the at least one semiconductor die; and a pair of protrusion ribs extending in opposite directions from the pair of lateral portions, respectively; mounting the pair of locking bars on the substrate of the semiconductor device and at two opposite sides of the at least one semiconductor die; and engaging the heat spreader with the substrate by pushing the heat spreader body towards the substrate and engaging the pair of protrusion ribs within the locking hooks of the pair of locking bars.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

Figure 1:
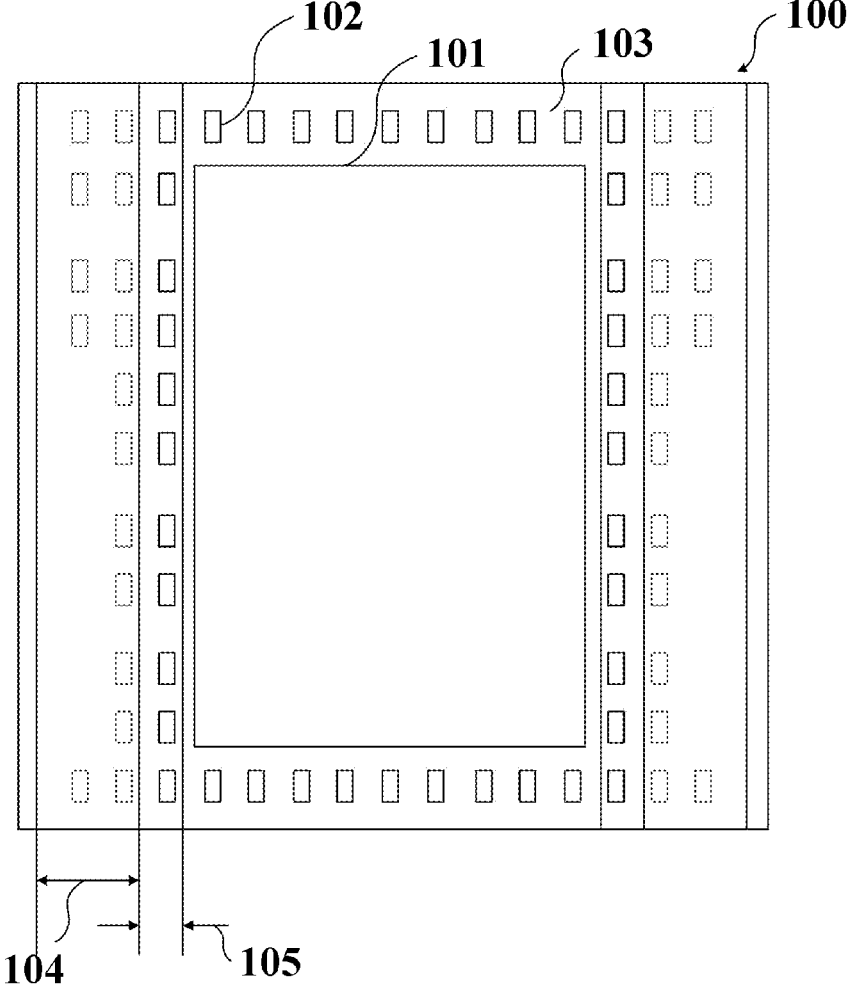
FIG. 1 illustrates a top view of a conventional semiconductor device.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In semiconductor devices, heat spreaders may be attached to a semiconductor die to enhance heat dissipation. The configuration of a heat spreader may vary depending on specific applications. In some cases, a heat spreader may be disposed on top of a semiconductor die using for example adhesive or solder. In some other cases, a heat spreader and a substrate may be designed to be of specific structures to engage with each other, where the substrate and the heat spreader may require extra structure design and extra machining. Such adaptations to both the substrate and the heat spreader may increase the complexity of the overall device structure and thus may harm the yield of the semiconductor device.

According to some embodiments of the present application, a heat spreader assembly that allows convenient attachment to a substrate for a semiconductor die without changing the substrate structure is provided. The heat spreader can be in thermal contact with the semiconductor die to allow heat dissipation from the semiconductor die through the heat spreader, thereby ensuring the semiconductor die operating normally within a rated temperature range.

Figure 2A:
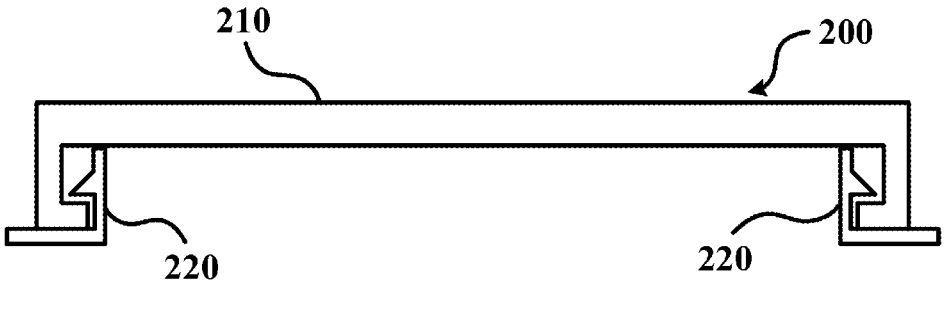
FIG. 2A illustrates a cross-sectional view of a heat spreader assembly according to an embodiment of the present application.

FIG. 2A shows a cross-sectional view of a heat spreader assembly according to an embodiment of the present application. Referring to FIG. 2A, a heat spreader assembly 200 includes a heat spreader 210 and a pair of locking bars 220. The heat spreader 210 is used for engaging and receiving one or more electronic devices of a semiconductor device (not shown) within a cavity formed within the heat spreader 210. In some embodiments, the heat spreader 210 may be formed of copper, aluminum, silver or any other metal, alloy or other materials having good thermal conductivity. As the electronic devices are in operation, the heat spreader 210 may assist heat dissipation and enhance performance of the electronic devices. The pair of locking bars 220 is used for providing an attachment location of the heat spreader 210 onto a substrate of the semiconductor device (not shown), and further, for locking the heat spreader 210 to the substrate.

Figure 2B:
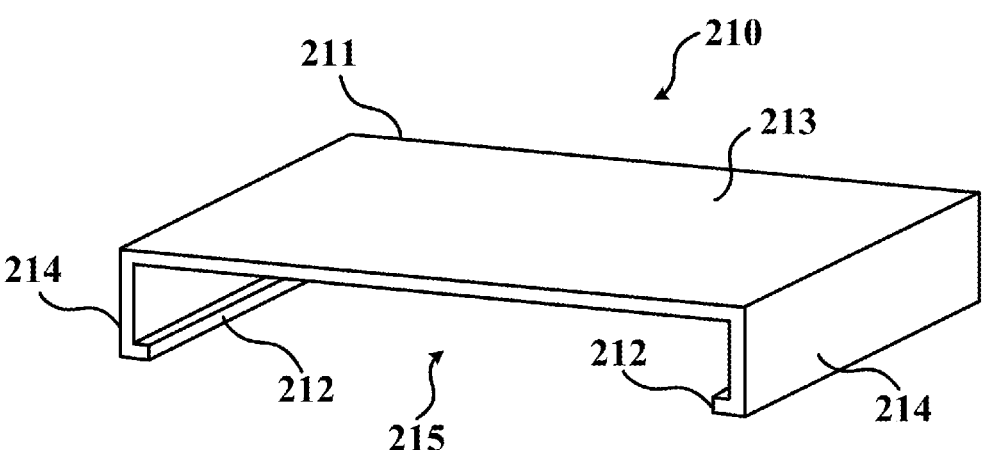
FIG. 2B illustrates a perspective view of a heat spreader according to an embodiment of the present application.
Figure 2C:
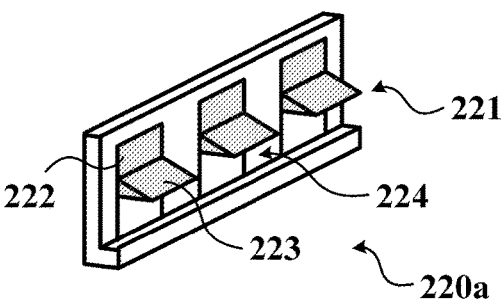
FIGS. 2C and 2D illustrate perspective views of locking bars with three locking hooks according to two embodiments of the present application.
Figure 2D:
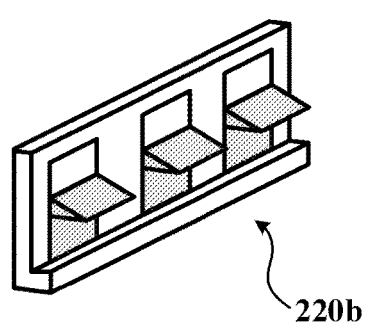

FIGS. 2B to 2D show perspective views of the heat spreader 210 and the pair of locking bars 220 of FIG. 2A with more details.

Referring to FIG. 2B, the heat spreader 210 includes a heat spreader body 211 and a pair of protrusion ribs 212. Specifically, the heat spreader body 211 includes a top portion 213 and a pair of lateral portions 214 extending from the top portion 213. The heat spreader body 211 defines a space 215 for receiving electronic devices (not shown) such as at least one semiconductor die therein. The pair of protrusion ribs 212 extends in opposite directions from the pair of lateral portions 214, respectively. Preferably, as shown in FIG. 2B, both of the pair of protrusion ribs 212 may extend horizontally inward with respect to the pair of lateral portions 214. Aspects of the present application are not limited thereto, the pair of protrusion ribs 212 may also extend outward as to be illustrated below.

Referring to FIG. 2C, part of one locking bar 220*a* according to an embodiment of the present application is shown. The locking bar 220*a* includes multiple locking hooks 221 disposed along the locking bar 220*a*. Preferably, each locking hook 221 may be of an L-shaped structure. A locking hook body 222 of the locking hook 221, that is, the vertical part of the L-shaped structure of the locking hook 221, can be aligned with the locking bar 220*a*. A hooking part 223, that is, the horizontal part of the L-shaped structure of the locking hook 221, extends horizontally with respect to the locking hook body 222. As can be seen in FIG. 2C, a slot 224 extending along the locking bar 220*a* may be defined underneath the multiple locking hooks 221. Preferably, the multiple locking hooks 221 may be formed by punching at specific positions of the locking bar 220*a*. For example, the multiple locking hooks 221 may be formed by punching and bending lower sections of the locking bar 220*a*, thereby forming through holes in the locking bar 220*a*, while upper sections of the locking bar 220*a* remain not bent. Aspects of the present application are not limited thereto. Referring to FIG. 2D, the punching process may alternatively be conducted on the upper sections of the locking bar 220*b*.

Figure 3A:
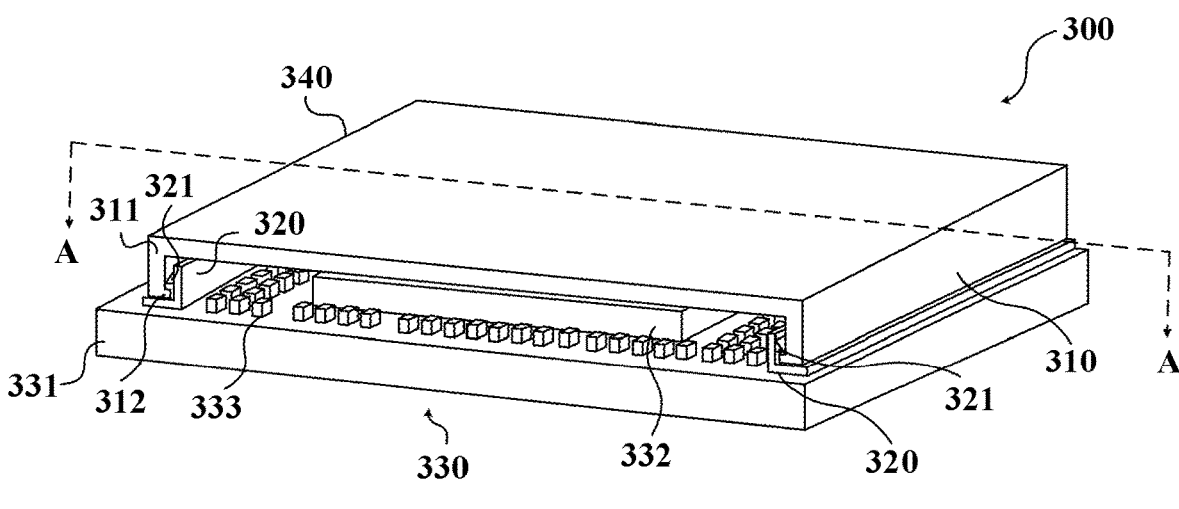
FIG. 3A illustrates a perspective view of a semiconductor assembly according to an embodiment of the present application.
Figure 3B:
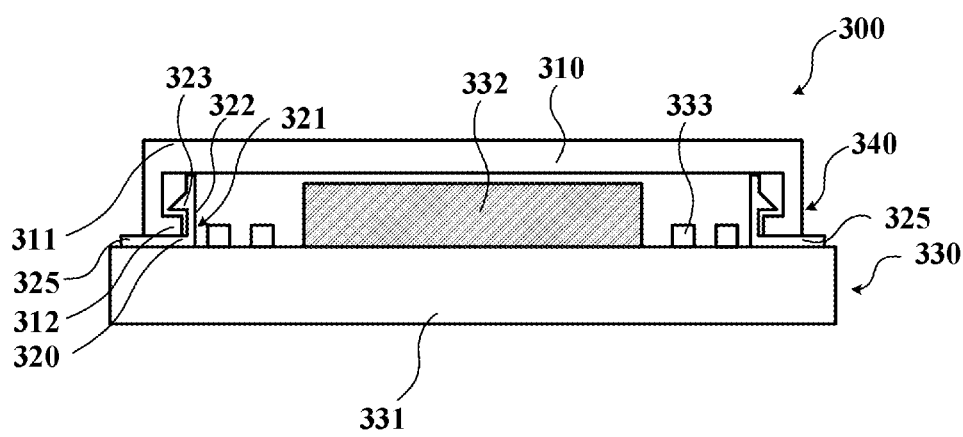
FIG. 3B illustrates a cross-sectional view of the semiconductor assembly shown in FIG. 3A.

As aforementioned, the heat spreader assembly shown in FIG. 2A may be assembled with a semiconductor device for heat dissipation. FIG. 3A illustrates a perspective view of a semiconductor assembly 300 according to an embodiment of the present application. FIG. 3B shows a cross-sectional view of the semiconductor assembly 300 along line A-A in FIG. 3A.

Referring to FIGS. 3A and 3B, the semiconductor assembly 300 includes a semiconductor device 330 and a heat spreader assembly 340. The semiconductor device 330 includes a substrate 331, on which at least one semiconductor die 332 and optionally, discrete devices 333 are mounted. In some cases, the at least one semiconductor die 332 and the discrete devices 333 may be mounted on the substrate 331 with a tight layout, leaving limited room between the at least one semiconductor die 332 and the discrete devices 333 surrounding the at least one semiconductor die 332. Due to the tight layout, the heat spreader assembly 340 cannot be disposed at the periphery of the at least one semiconductor die 332, instead, the heat spreader assembly 340 may need to span across both the at least one semiconductor die 332 and the discrete devices 333. That is, the heat spreader assembly 340 may be attached to the substrate 331 outside the total layout of the at least one semiconductor die 332 and the discrete devices 333. It can be appreciated that the heat spreader assembly 340 may take a form and size substantially corresponding to the layout of the semiconductor die 332 and the discrete devices 333. Also, in some other embodiments, the heat spreader assembly 340 may be mounted above the semiconductor die 332 only, without covering the discrete devices 333 surrounding the semiconductor die 332.

In particular, the heat spreader assembly 340 includes a heat spreader 310 and a pair of locking bars 320. The pair of locking bars 320 is mounted on the substrate 331 of the semiconductor device 330. Preferably, the pair of locking bars 320 is mounted at two opposite sides of the at least one semiconductor die 332, either spanning or not spanning across the adjacent discrete devices 333. Each of the pair of locking bars 320 includes a plurality of locking hooks 321 disposed along the locking bar 320. For each locking bar 320, a slot is defined underneath the locking hooks 321 along the locking bar 320. The heat spreader 310 includes a heat spreader body 311 and a pair of protrusion ribs 312 that extends at two sides of the heat spreader body 311. When the heat spreader 310 is pushed downward and assembled with the substrate 331, the pair of protrusion ribs 312 slides past the locking hooks 321, and further, engages within the slots of the pair of locking bars 320. The engagement between the protrusion ribs 312 of the heat spreader 310 and the locking bars 320 prevents the heat spreader 310 from moving away from the pair of locking bars 320, and thus prevents the heat spreader 310 from moving away from the substrate 331. Preferably, the heat spreader 310 may be made of metal or alloy which is generally flexible to allow for slight deformation upon sliding the pair of protrusion ribs 312 past the locking hooks 321 to temporarily expand the pair of protrusion ribs 312 outward during the assembling process. Preferably, the pair of locking bars 320 may be made of metal or alloy which is generally flexible to allow for slight deformation upon sliding the pair of protrusion ribs 312 past the locking hooks 321 to temporarily push the pair of locking bars 320 inward during the assembling process. Or preferably, both the heat spreader 310 and the pair of locking bars 320 may be made of metal or alloy to allow for deformation, respectively, wherein upon sliding the pair of protrusion ribs 312 past the locking hooks 321, the pair of protrusion ribs 312 may expand outward and the pair of locking bars 320 may accordingly be pushed inward.

Further referring to FIG. 3B, the pair of locking bars 320 may include locking bar feet 325 that are in contact with the substrate 331. The locking bar feet 325 may be attached to the substrate 331 via such as adhesive or solder. Preferably, a top area of the locking bar feet 325 may be larger than a bottom area of the protrusion ribs 312, so as to provide stable support for the heat spreader 310. In some alternative embodiments, the locking bar feet 325 may be attached to the substrate 331 in other manners, such as through threaded or riveted connection.

Figure 3C:
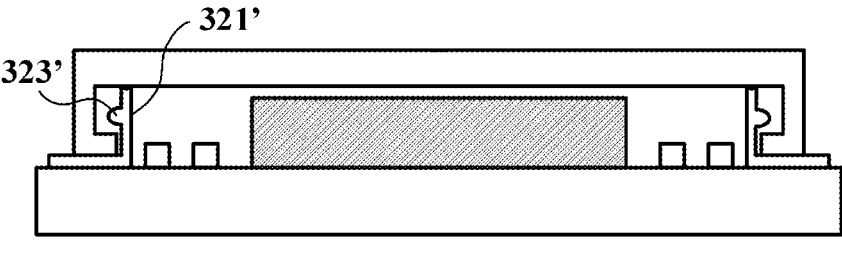
FIG. 3C illustrates a cross-sectional view of a semiconductor assembly according to another embodiment of the present application.

Referring to FIGS. 3B and 3C, the locking hooks 321 may take different forms. As shown in FIG. 3B, the locking hook 321 includes a locking hook body 322 and a hooking part 323. The hooking part 323 may be a wedge with a triangular cross section. Upon pushing the heat spreader 310 toward the substrate 331, the protrusion ribs 312 slide along the wedges of the pair of locking bars 320 to expand outward. After passing the wedges, since the protrusion ribs 312 tend to restore to the original shape instead of the expanded shape, the protrusion ribs 312 retract to restore the original shape. Accordingly, the protrusion ribs 312 can be engaged within the slots of the locking bars 320. As shown in FIG. 3B, after engaging the heat spreader 310 to the locking bars 320, the locking hook body 322 extends in parallel with the corresponding lateral portion of the heat spreader 310, and the wedge is angled relative to the lateral portion. It can be appreciated that, in some embodiments, instead of the heat spreader 310 slightly deforming during the assembling process, the locking bars 320 may slightly deform. In some other embodiments, both the heat spreader 310 and the locking bars 320 may slightly deform during the assembling process, which is similar as illustrated above.

The locking hooks may take other forms so long as the protrusion ribs can slide past the locking hooks and be engaged with the locking hooks. As shown in FIG. 3C, the hooking part 323' of the locking hooks 321' may be of a hemispherical cross section. Further, the height of the locking hooks may vary, depending on the structure of the heat spreader to be engaged with the locking hooks. In the embodiment shown in FIG. 3B, the locking hooks 321 may be disposed at a height relative to the locking bars 320 that allows the protrusion ribs 312 be in contact with a bottom edge of the locking hooks 321. In some other embodiments, the height of the locking hooks 321 may be configured that after the protrusion ribs 312 rest within the slots of the locking bars 320, there exist clearances between the locking hooks 321 and the corresponding protrusion ribs 312.

Figure 4A:
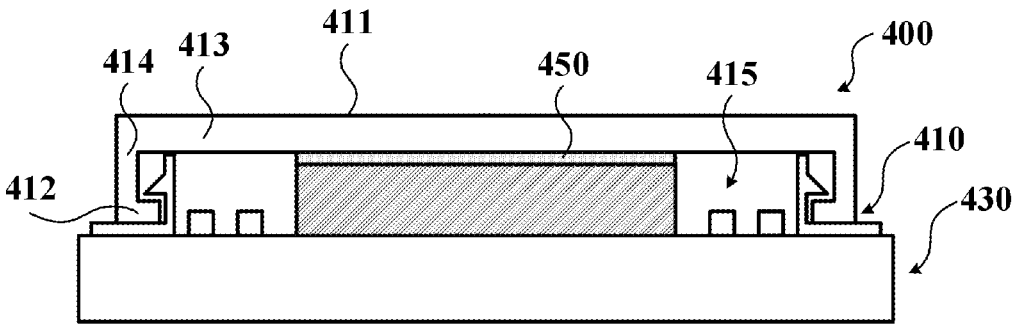
FIG. 4A illustrates a cross-sectional view of a semiconductor assembly according to another embodiment of the present application.

A heat spreader may be adapted to achieve further functions as illustrated below. FIG. 4A illustrates a cross-sectional view of a semiconductor assembly 400, and FIG. 4B shows a top view of the semiconductor assembly 400 shown in FIG. 4A.

Figure 4B:
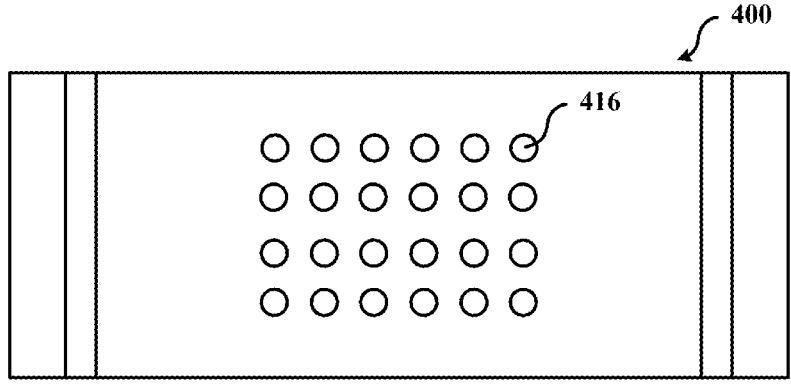
FIG. 4B shows a top view of the semiconductor assembly shown in FIG. 4A.

The semiconductor assembly 400 shown in FIGS. 4A and 4B includes a heat spreader 410 and a semiconductor device 430. In particular, the heat spreader 410 includes a heat spreader body 411 and a pair of protrusion ribs 412. The heat spreader body 411 defines a space 415 for receiving at least one semiconductor die of the semiconductor device 430, when the heat spreader 410 is assembled with the semiconductor device 430. In particular, the heat spreader body 411 may include a top portion 413 and a pair of lateral portions 414 extending from the top portion 413. The top portion 413 and the pair of lateral portions 414 together define the space 415 for receiving the at least one semiconductor die. Preferably, the height of the heat spreader 410 and the height of locking bars may be configured that the top portion 413 of the heat spreader 410 may be in contact with the at least one semiconductor die of the semiconductor device 430 when the pair of protrusion ribs 412 is engaged within the slots defined by the pair of locking bars. In some embodiments, the top portion 413 is formed as a flat plate that can easily contact a semiconductor die having a flat top surface. In some other embodiments, the top portion 413 may be formed in any other desired shapes and structures, depending on the shape and structure of the semiconductor die or dice. For example, if two or more semiconductor dice with different thicknesses require heat dissipation by the heat spreader 410, the top portion 413 can include two or more regions each having a depth corresponding to the thickness of one of the two or more semiconductor dice thereunder.

Further referring to FIG. 4A, the top portion 413 of the heat spreader body 411 may be not directly in contact with the semiconductor die, i.e., a thickness of the semiconductor die is smaller than a depth of the space 415. Rather, a thermally conductive material 450 can be filled within a gap formed between the top portion 413 and a top surface of the semiconductor die, to ensure desired thermal contact between the heat spreader body 411 and the semiconductor die. In some embodiments, the top portion 413 may include a plurality of holes 416 as shown in the top view of FIG. 4B. Through the holes 416, the thermally conductive material can be applied into the gap between the top portion 413 and the semiconductor die, which later can be solidified as the thermally conductive layer 450. For example, the thermally conductive material may be a fluid material at room temperature or at a higher temperature (e.g., 80 centi-degrees or higher) so that it can be applied between the top portion 413 and the semiconductor die at room temperature through the holes 416, while a curing process can then be performed on the semiconductor assembly to solidify the thermally conductive layer 450. In some other embodiments, the thermally conductive material can be solidified through a radiation process such as through ultraviolet radiation. In a preferred embodiment, the array of holes 416 may substantially overlap with the semiconductor die when the semiconductor device 430 is assembled with the heat spreader 410.

Figure 5:
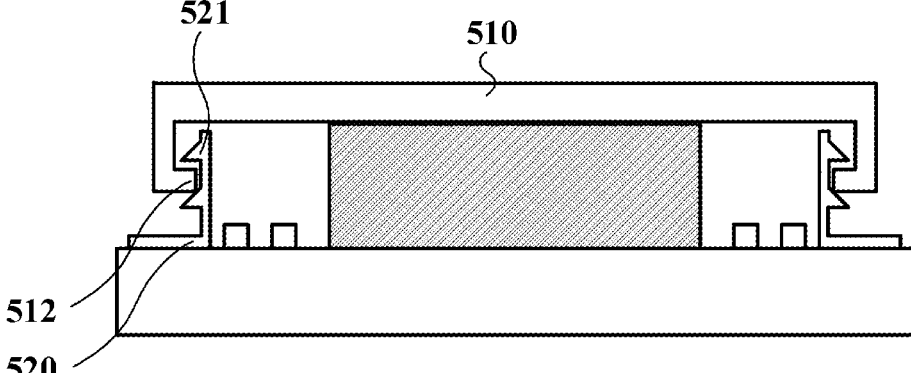
FIG. 5 illustrates a cross-sectional view of a semiconductor assembly according to another embodiment of the present application.

A locking bar may also be adapted so as to provide options of heat spreader being at different heights. Referring to FIG. 5, according to an embodiment of the present application, each locking bar 520 may include multiple locking hooks 521 vertically disposed on the locking bar 520. Due to the existence of multiple locking hooks 521, multiple slots are defined at different heights of the heat spreader 510. Therefore, different heat spreaders may engage with respective different slots to achieve attachment at different heights. For example, as shown in FIG. 5, the heat spreader 510 may be engaged within the upper slots because the below semiconductor die prevents further downward movement of the heat spreader 510. However, when another semiconductor die with a smaller thickness is mounted on the substrate, the heat spreader 510 may then be engaged within the lower slots underneath the lower locking hooks.

Figure 6:
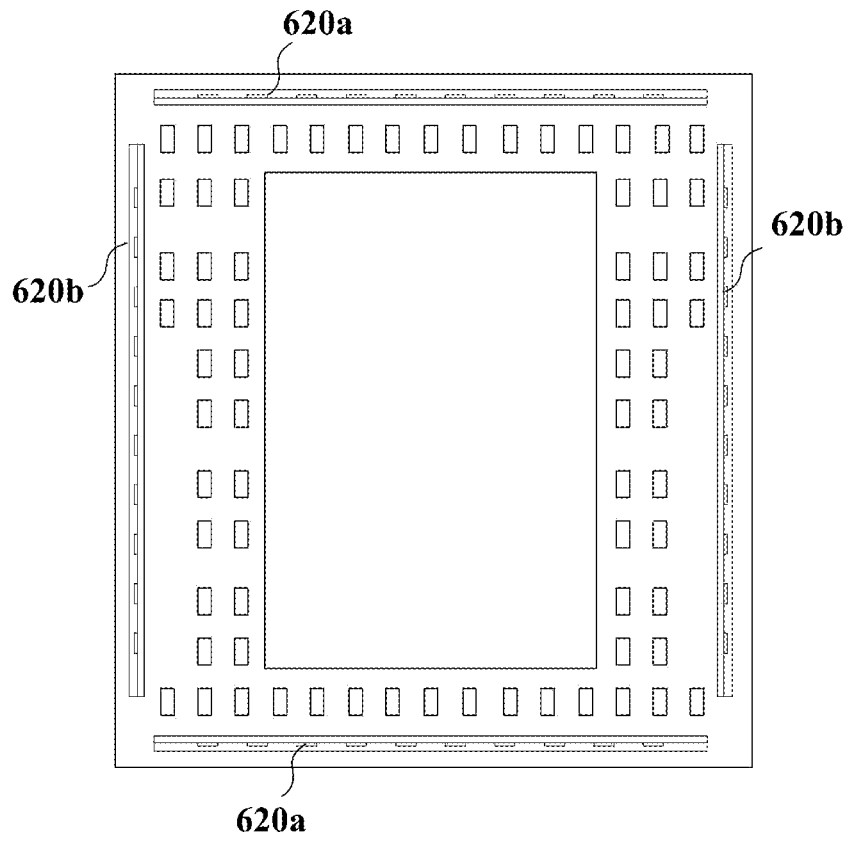
FIG. 6 illustrates a top view of a semiconductor device mounted with two pairs of locking bars according to another embodiment of the present application.

In the above, a heat spreader assembly may include a pair of locking bars, and correspondingly, a heat spreader may include a pair of lateral portions and a pair of protrusion ribs. Aspects of the present application are not limited thereto. As shown in FIG. 6, along with a first pair of locking bars 620a disposed on a substrate of a semiconductor device, a second pair of locking bars 620b may be attached to the substrate of the semiconductor device. In particular, the second pair of locking bars 620b may be mounted on another two opposite sides of at least one semiconductor die of the semiconductor device. The second pair of locking bars 620b may take similar form as the first pair of locking bars 620a. Accordingly, a heat spreader may further include a second pair of lateral portions and another pair of protrusion ribs extending from the second pair of lateral portions, for engagement with the second pair of locking bars 620b.

Figure 7A:
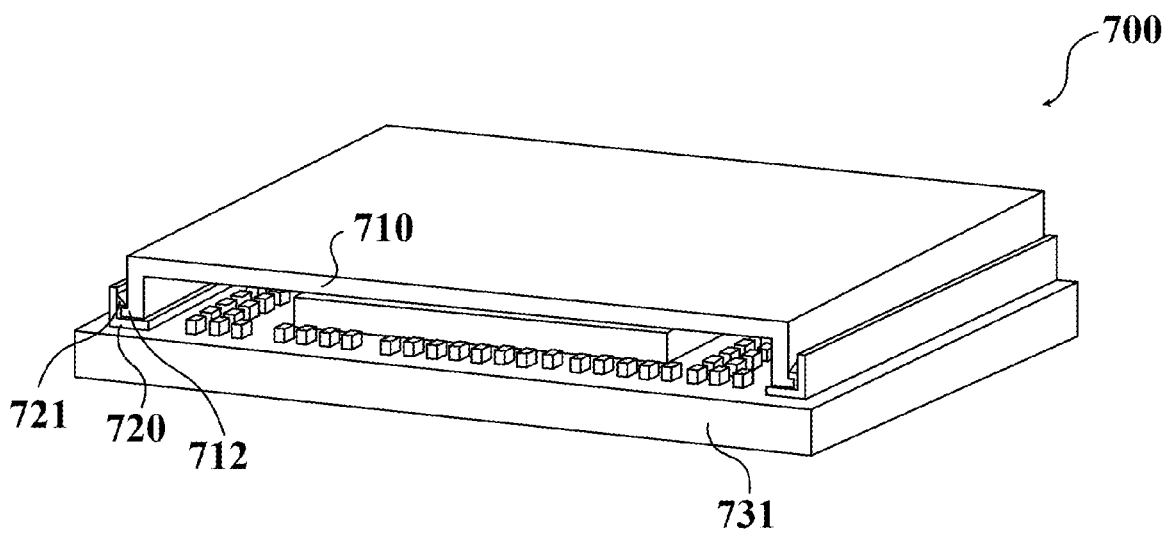
FIG. 7A illustrates a perspective view of a semiconductor assembly according to another embodiment of the present application.
Figure 7B:
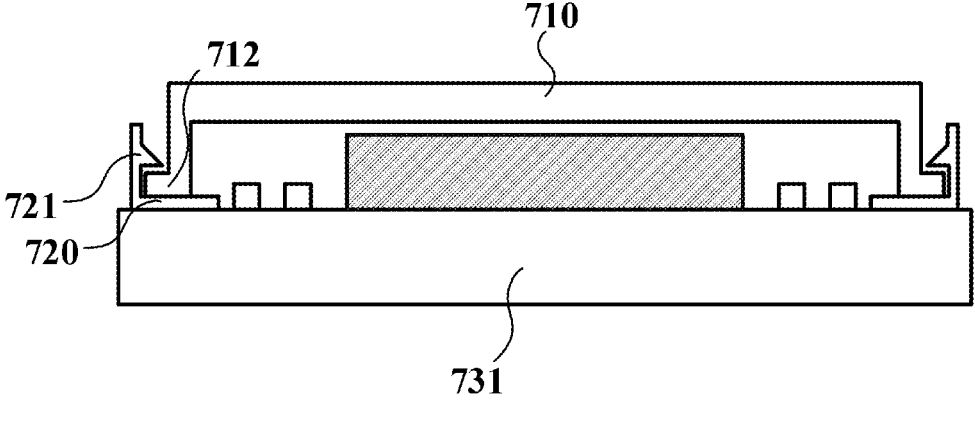
FIG. 7B illustrates a cross-sectional view of the semiconductor assembly shown in FIG. 7A.

FIGS. 7A and 7B show a semiconductor assembly 700 according to another embodiment of the present application. As shown in FIGS. 7A and 7B, a pair of protrusion ribs 712 of a heat spreader 710 may be configured facing away from each other, to engage with a pair of locking bars 720. The locking bars 720 have locking hooks 721 facing toward each other, so as to engage with the protrusion ribs 712 of the heat spreader 710. Slightly different from the embodiment shown in FIGS. 3A and 3B, upon pushing the heat spreader 710 towards the substrate 731, the locking bars 720 may temporarily expand outward to ensure that the pair of protrusion ribs 712 can slide past the locking hooks 721 and then rest within slots defined by the locking bars 720. It can be appreciated that, in some embodiments, instead of the locking bars 720 slightly deforming during the assembling process, the heat spreader 710 may slightly deform. In some other embodiments, both the heat spreader 710 and the locking bars 720 may slightly deform during the assembling process, which is similar as illustrated above.

FIGS. 8A to 8D illustrate steps of a method for making a semiconductor assembly. The semiconductor assembly may have a structure similar as the semiconductor assembly shown in FIGS. 3A-7B, for example.

Figures 8A, 8B:
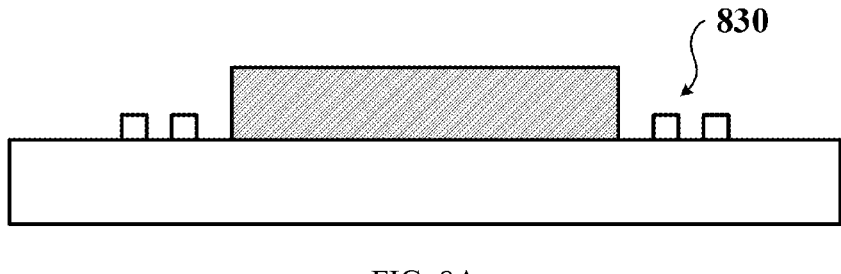
FIGS. 8A to 8D are cross-sectional views illustrating steps of a method for making a semiconductor assembly according to another embodiment of the present application.
Figures 8C, 8D:
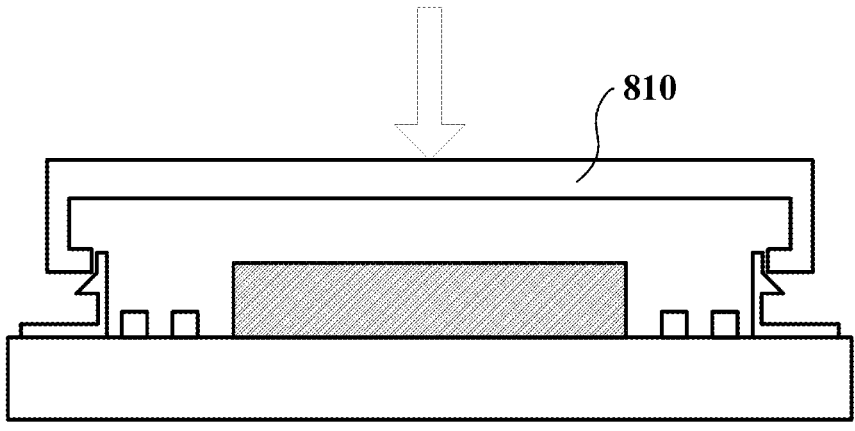

Referring to FIGS. 8A to 8D, the method starts with providing a heat spreader 810, a pair of locking bars 820 and a semiconductor device 830. As shown in FIG. 8B, the pair of locking bars 820 may be mounted on the substrate of the semiconductor device 830. Further, as shown in FIG. 8C, the heat spreader 810 is pushed toward the substrate. The protrusion ribs of the heat spreader 810 may be preferably made of a flexible material to expand outward or shift inward (as shown in FIGS. 7A and 7B) to allow a sliding action of the protrusion ribs past the locking hooks of the pair of locking bars 820. Finally, as shown in FIG. 8D, the heat spreader 810 is engaged with substrate since the protrusion ribs of the heat spreader 810 are engaged within the slots of the locking bars 820, preventing the heat spreader 810 from moving away from the substrate of the semiconductor device 830.

The discussion herein included numerous illustrative figures that showed various portions of a heat spreader for use with a semiconductor component and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A heat spreader assembly for use with a semiconductor device comprising a substrate and at least one semiconductor die mounted on the substrate, the heat spreader assembly comprising:

a pair of locking bars mounted on the substrate of the semiconductor device and at two opposite sides of the at least one semiconductor die, wherein each of the pair of locking bars comprises a plurality of locking hooks disposed along the locking bar and defines a slot extending along the locking bar; and a heat spreader comprising:

a heat spreader body comprising a top portion and a pair of lateral portions extending from the top portion, the heat spreader body defining a space for receiving the at least one semiconductor die; and a pair of protrusion ribs extending in opposite directions from the pair of lateral portions, respectively, wherein the pair of protrusion ribs is configured to, when the heat spreader body is pushed towards the substrate, slide past the locking hooks of the pair of locking bars and be engaged within the slots to prevent the heat spreader from moving away from the substrate of the semiconductor device.

2. The heat spreader assembly according to claim 1, wherein the top portion of the heat spreader body is in thermal contact with the at least one semiconductor die when the pair of protrusion ribs is engaged within the slots defined by the pair of locking bars.

3. The heat spreader assembly according to claim 2, wherein the top portion of the heat spreader body is in thermal contact with the at least one semiconductor die through a thermally conductive layer.

4. The heat spreader assembly according to claim 3, wherein the heat spreader body comprises a plurality of holes disposed on the top portion, wherein the thermally conductive layer is applied between the top portion and the at least one semiconductor die through the plurality of holes.

5. The heat spreader assembly according to claim 1, wherein each locking hook comprises a locking hook body extending within the lateral portion and a wedge extending at an angle relative to the lateral portion.

6. The heat spreader assembly according to claim 1, further comprising:

another pair of locking bars mounted on the substrate of the semiconductor device and at another two opposite sides of the at least one semiconductor die, wherein each of the another pair of locking bars comprises a plurality of locking hooks disposed along the locking bar and defines a slot extending along the locking bar; and wherein the heat spreader further comprises:

another pair of lateral portions of the heat spreader body extending from the top portion; and another pair of protrusion ribs extending in opposite directions from the another pair of lateral portions, respectively, wherein the another pair of protrusion ribs is configured to, when the heat spreader body is pushed towards the substrate, slide past the locking hooks of the another pair of locking bars and be engaged within the slots to prevent the heat spreader from moving away from the substrate of the semiconductor device.

7. A semiconductor assembly, comprising:

a semiconductor device comprising a substrate and at least one semiconductor die mounted on the substrate; and a heat spreader assembly mounted with the semiconductor device, comprising:

a pair of locking bars mounted on the substrate of the semiconductor device and at two opposite sides of the at least one semiconductor die, wherein each of the pair of locking bars comprises a plurality of locking hooks disposed along the locking bar and defines a slot extending along the locking bar; and a heat spreader comprising:

a heat spreader body comprising a top portion and a pair of lateral portions extending from the top portion, the heat spreader body defining a space for receiving the at least one semiconductor die; and a pair of protrusion ribs extending in opposite directions from the pair of lateral portions, respectively, wherein the pair of protrusion ribs is configured to, when the heat spreader body is pushed towards the substrate, slide past the locking hooks of the pair of locking bars and be engaged within the slots to prevent the heat spreader from moving away from the substrate of the semiconductor device.

8. The semiconductor assembly according to claim 7, wherein the top portion of the heat spreader body is in thermal contact with the at least one semiconductor die when the pair of protrusion ribs is engaged within the slots defined by the pair of locking bars.

9. The semiconductor assembly according to claim 8, wherein the top portion of the heat spreader body is in thermal contact with the at least one semiconductor die through a thermally conductive layer.

10. The semiconductor assembly according to claim 9, wherein the heat spreader body comprises a plurality of holes disposed on the top portion, wherein the thermally conductive layer is applied between the top portion and the at least one semiconductor die through the plurality of holes.

11. The semiconductor assembly according to claim 7, wherein each locking hook comprises a locking hook body extending within the lateral portion and a wedge extending at an angle relative to the lateral portion.

12. The semiconductor assembly according to claim 7, further comprising:

another pair of locking bars mounted on the substrate of the semiconductor device and at another two opposite sides of the at least one semiconductor die, wherein each of the another pair of locking bars comprises a plurality of locking hooks disposed along the locking bar and defines a slot extending along the locking bar; and wherein the heat spreader further comprises:

another pair of lateral portions of the heat spreader body extending from the top portion; and another pair of protrusion ribs extending in opposite directions from the another pair of lateral portions, respectively, wherein the another pair of protrusion ribs is configured to, when the heat spreader body is pushed towards the substrate, slide past the locking hooks of the another pair of locking bars and be engaged within the slots to prevent the heat spreader from moving away from the substrate of the semiconductor device.

13. A method for making a semiconductor assembly, comprising:

providing a semiconductor device, wherein the semiconductor device comprises a substrate and at least one semiconductor die mounted on the substrate;

providing a pair of locking bars, wherein each of the pair of locking bars comprises a plurality of locking hooks disposed along the locking bar and defines a slot extending along the locking bar;

providing a heat spreader comprising:

a heat spreader body comprising a top portion and a pair of lateral portions extending from the top portion, the heat spreader body defining a space for receiving the at least one semiconductor die; and a pair of protrusion ribs extending in opposite directions from the pair of lateral portions, respectively;

mounting the pair of locking bars on the substrate of the semiconductor device and at two opposite sides of the at least one semiconductor die; and engaging the heat spreader with the substrate by pushing the heat spreader body towards the substrate and engaging the pair of protrusion ribs within the locking hooks of the pair of locking bars.

14. The method according to claim 13, wherein the top portion of the heat spreader body is in thermal contact with the at least one semiconductor die when the pair of protrusion ribs is engaged within the slots defined by the pair of locking bars.

15. The method according to claim 14, wherein the top portion of the heat spreader body is in thermal contact with the at least one semiconductor die through a thermally conductive layer.

16. The method according to claim 15, wherein the heat spreader body comprises a plurality of holes disposed on the top portion, wherein the thermally conductive layer is applied between the top portion and the at least one semiconductor die through the plurality of holes.

17. The method according to claim 13, wherein each locking hook comprises a locking hook body extending within the lateral portion and a wedge extending at an angle relative to the lateral portion.

* * * * *